United States Patent
Scott et al.

(10) Patent No.: US 8,394,700 B2
(45) Date of Patent: Mar. 12, 2013

(54) DEVICE INCLUDING MEMORY ARRAY AND METHOD THEREOF

(75) Inventors: Gregory James Scott, Inkom, ID (US); Mark Michael Nelson, Pocatello, ID (US); Thierry Coffi Herve Yao, Lake Oswego, OR (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 182 days.

(21) Appl. No.: 12/765,731

(22) Filed: Apr. 22, 2010

(65) Prior Publication Data
US 2011/0260232 A1  Oct. 27, 2011

(51) Int. Cl.
*H01L 21/336* (2006.01)

(52) U.S. Cl. . 438/266; 438/267; 257/315; 257/E29.129; 257/E21.679

(58) Field of Classification Search .............. 257/315, 257/317, 321, 390, 510, E27.103, E21.422, 257/E21.679, E29.129; 438/257–267; 365/185.17
See application file for complete search history.

(56) References Cited

U.S. PATENT DOCUMENTS

| | | | |
|---|---|---|---|
| 5,808,336 A * | 9/1998 | Miyawaki | 257/315 |
| 6,438,080 B1 | 8/2002 | Shoji et al. | |
| 6,548,848 B2 * | 4/2003 | Horiguchi et al. | 257/296 |
| 6,819,590 B2 * | 11/2004 | Goda et al. | 365/185.03 |
| 6,844,588 B2 | 1/2005 | Cavins et al. | |
| 2007/0138576 A1 * | 6/2007 | Mizukami et al. | 257/390 |

* cited by examiner

*Primary Examiner* — David Vu
(74) *Attorney, Agent, or Firm* — Abel Law Group, LLP

(57) ABSTRACT

An electronic device includes a first memory cell and a second memory cell, of a nonvolatile memory array. The first memory cell includes a body region, a gate structure, a source region, and a drain region. The second memory cell includes a body region, a gate structure, a source region, and a drain region. In one embodiment, the body of the second memory cell is physically isolated from the body region of the first memory cell. A bitline segment is electrically connected to the drain region of the first memory cell and to the drain region of the second memory cell.

20 Claims, 14 Drawing Sheets

|  | Vcg262 | Vcg263 | Vs461 | Vd121 | V2462 | Vd122 |
|---|---|---|---|---|---|---|
| Erase 321/322 (FN/Vtl) | 0 | Vph | Vph | Vph | Vph | Vph |
| Pgm 321 (FN/Vth) | Vph | 0 or Vinh | 0 | 0 | Vinh | Vinh |
| Pgm 321 (HCI/Vth) | Vph/2 | 0 | 0 | Vph | Vd122 | Vd122 |
| Erase 321/322 (FN/Vth) | Vph | 0 | 0 | 0 | 0 | 0 |
| Pgm 321 (FN/Vtl) | 0 | Vinh-Vph | Vph | Vph | Vinh | Vinh |
| Read 321-323 | Vread | 0 | 0 | >Vs461 | 0 | >Vs461 |

*FIG. 25*

DEVICE INCLUDING MEMORY ARRAY AND METHOD THEREOF

BACKGROUND

1. Field of the Disclosure

The present invention relates to electronic devices, and more particularly, to electronic devices having nonvolatile memory.

2. Description of the Related Art

Conventional memory arrays include pluralities of individual memory cells. The memory cells can be programmed for desired logic or memory states. When programmed, each cell of the memory array will have a program state that represents either a high or low signal (i.e., on or off) during a read operation. Memories having cells that maintain their programmed state when powered down are referred to as nonvolatile memories.

Nonvolatile memories are organized into one or more nonvolatile memory (NVM) arrays organized by rows and columns. Typically, the rows of an NVM array are referred to as being along wordlines and the columns of the array are referred to as being along bitlines, although this definition is arbitrary depending on the physical orientation of the array. The method of reading the individual memory cells from a NVM array may vary and may determine the NVM architecture. There are two commonly used NVM architectures: a NOR architecture and a NAND architecture. In both NVM architectures the wordlines are able to change the on/off state of all memory cells on a specified row. The information of a specific memory cell of the NVM array can be determined by measuring the current in the column (bitline) containing this memory cell, referred to as the selected column, while adjusting the wordline potential of the row containing this memory cell, referred to as the selected row, relative to the wordline potentials of the other rows, referred to as the unselected rows. In such a manner the conductivity of a specified cell can be determined by measuring the current flowing into or out of the selected column.

For a NOR architecture, the memory cells within a given column are connected in parallel so that current can flow into, or out of, the column if any memory cell in the given column is conducting. For the NOR architecture, the wordline potentials of unselected rows are adjusted to limit the current flowing through memory cells connected to the unselected rows, e.g., current flowing into or out of the column, regardless of their state, to allow the state of a memory cell in the selected row to be detected For a NAND memory architecture the memory cells within a given column are connected in series. Therefore, for current to conduct through the column all memory cells within a given column must be conducting. To inspect the information held within a specified memory cell of a NAND architecture, the wordlines of unselected rows are set to a value so that the memory cells of unselected rows are sufficiently conducting to determine the conductivity of the memory cell in the selected row for some specified selected row wordline potential.

BRIEF DESCRIPTION OF THE DRAWINGS

The invention is illustrated by way of example and not limitation in the accompanying figures.

FIG. 25 includes an illustration of a table listing operating voltages in accordance with a specific embodiment of the disclosure.

Figure 1:
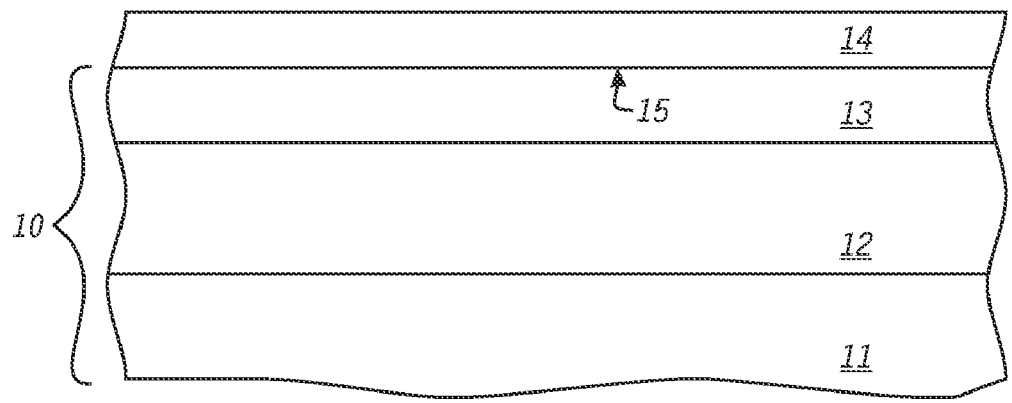
FIG. 1 includes an illustration of a workpiece after formation of a protective layer in accordance with a specific embodiment of the disclosure.

Those skilled in the art will appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device that includes a nonvolatile memory (NVM) array is disclosed. In one embodiment, the NVM array includes a first gate structure overlying a first body region of a substrate at a location where a first memory cell of the NVM array is being formed, and a second gate structure overlying a second body region of a substrate at a location where a second memory cell of the NVM array is being formed. The first body region is between the first gate structure and a conductive region. The second body region is between the second gate structure and the conductive region. The conductive region is a bitline segment of the NVM array that is electrically connected to a first drain region associated with the first gate structure, and to a second drain region associated with the second gate structure. According to another embodiment, an NVM array includes a first and second memory cell. A drain region of the first memory cell and a drain region of the second memory cell are electrically connected to a bitline segment, and a body of the first memory cell is physically isolated from a body of the second memory cell. The various embodiments of an electronic device including an NVM array will be better understood with reference to FIGS. 1-25.

The term "primary surface" is intended to mean a surface of a substrate from which memory cells within a memory array are subsequently formed. The primary surface may be an original surface of a substrate before forming any structures or may be a surface from which trenches or other permanent structures within the memory array are formed. For example, the memory array may be formed at least partly within an epitaxial layer overlying a base material, and electronic components within a peripheral area (outside the memory array) may be formed from the base material. In this example, the primary surface refers to the upper surface of the epitaxial layer, and not the original surface of the base material.

The term "stack" is intended to mean a plurality of layers or a plurality of at least one layer and at least one structure), wherein the plurality of layers or plurality of layer(s) and structure(s) provides an electronic function. For example, a nonvolatile memory stack can include layers used to form at least part of a nonvolatile memory cell.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B is true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims. Furthermore, to the extent not described herein, many details regarding specific materials, processing acts, and circuits are conventional and may be found in textbooks and other sources within the semiconductor and microelectronic arts.

FIG. 1 includes an illustration of a cross-sectional view of a portion of a workpiece where an integrated circuit is being formed. The integrated circuit can be a standalone memory, a microcontroller, or another integrated circuit that includes a memory. In one embodiment, a NVM array is being formed as at least a part of the integrated circuit, including a portion of the NVM array at the location illustrated at FIG. 1.

FIG. 1 illustrates a substrate 10 and a protective layer 14. The substrate 10 can include a monocrystalline semiconductor wafer, a semiconductor-on-insulator (SOI) wafer, a flat panel display (e.g., a silicon layer over a glass plate), or other substrate used to form electronics. In the specific embodiment of FIG. 1, the substrate 10 includes a monocrystalline semiconductor wafer, and is illustrated to include a layer 11, a conductive layer 12 overlying the layer 11, and a layer 13 overlying the conductive layer 12.

In accordance with the specific embodiment discussed herein, the layer 11 is a p-doped layer. One of ordinary skill in the art will recognize that with respect to other embodiments, the layer 11 can also be an n-doped layer, or can be an insulator layer, such as with an SOI substrate.

The conductive layer 12 is a conductive layer that can include a metal or a heavily doped portion of the substrate 10 from which a plurality of bitline segments of the NVM array will be formed. In accordance with the specific embodiment discussed herein, the conductive layer 12 is doped with an n-type dopant, i.e., layer 12 is n-doped, of sufficient concentration to be electrically connective. For example, n-doped layer 12 can have a doping concentration of greater than approximately $1E17$ atoms/cm**3.

The layer 13 is a doped layer of a particular conductivity type. In accordance with the specific embodiment discussed herein, the layer 13 has an opposite conductivity type from that of the conductive layer 12, and therefore, is a p-doped layer where various body regions of memory cells of the NVM array will be formed. A typical thickness of p-doped layer 13 is in the range of 0.5 um to 5 um.

A protective layer 14 has been formed over the substrate 10 to facilitate subsequent formation of features integrated with the substrate 10. For example, protective layer 14 can be an etch-stop layer, a polish stop layer, the like, and combinations thereof for various techniques used to form the NVM array, and can remain over any peripheral areas, e.g., portion of the integrated circuit where the NVM array is not being formed, until formation of the NVM array is substantially complete. The upper-most surface of the substrate 10 where p-doped layer 13 contacts protective layer 14 is a primary surface 15. Protective layer 14 can be a stack that can include an oxide, a nitride, the like, and combinations thereof including an oxynitride. Although not illustrated at FIG. 1, various other features, such as field isolation regions, can reside at peripheral portions of the workpiece of FIG. 1.

Figure 2:
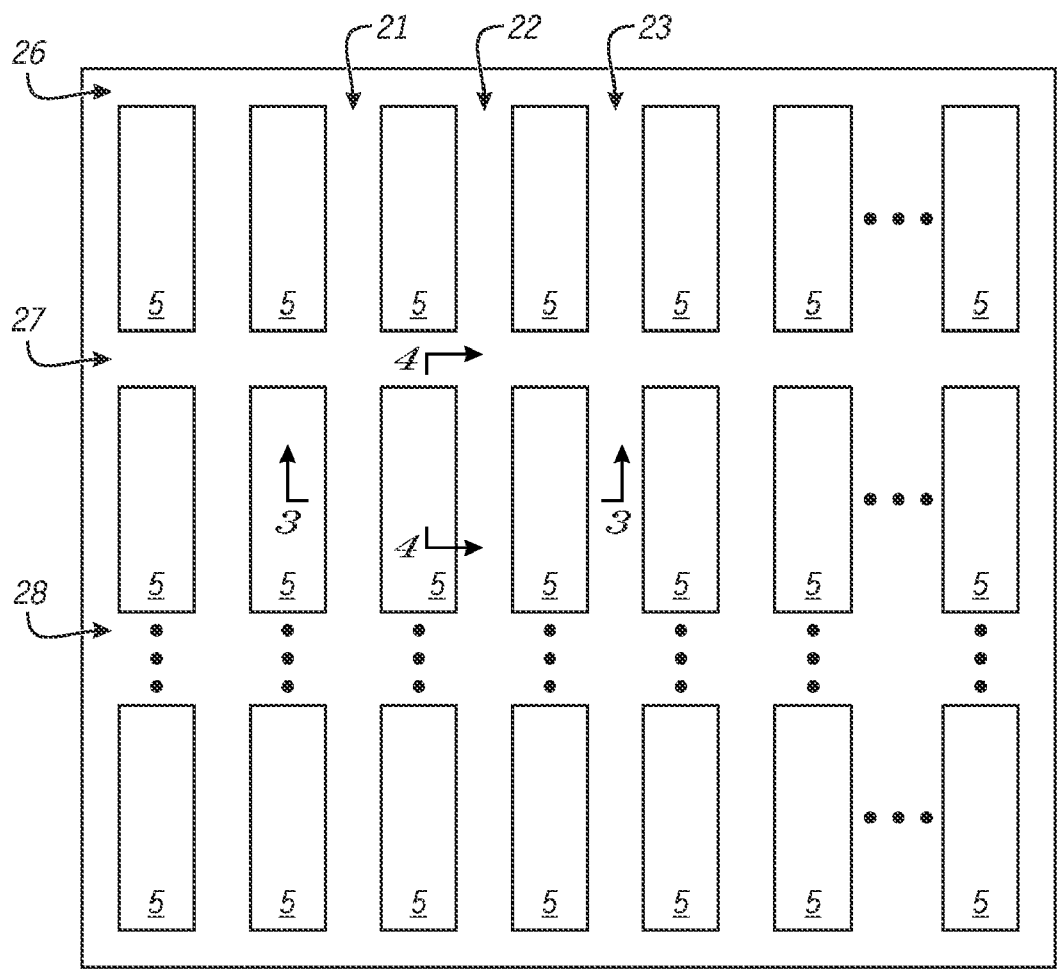
FIGS. 2-4 include illustrations of a top view and cross-sectional views of the workpiece of FIG. 1 after forming trenches in accordance with a specific embodiment of the disclosure.

A patterned resist layer (not illustrated) is formed over the workpiece that defines locations where trenches are to be formed within the substrate 10 as illustrated at FIG. 2. FIG. 2 includes an illustration of a top view of the workpiece after portions of protective layer 14, the layer 13, and the conductive layer 12 that are not protected by the patterned resist layer are removed by a conventional technique to form trenches at which portions of the layer 11 are exposed. The trenches illustrated at FIG. 2 include horizontal trenches 26-28, and vertical trenches 21-23 with respect to the top view of the workpiece. A plurality of regions 5 represent locations protected by the patterned resist layer where portions of protective layer 14, p-doped layer 13, and the conductive layer 12 remain after formation of vertical and horizontal trenches. Each region 5 represents a location where a portion of the NVM array, referred to as an NVM array segment, that includes a plurality of memory cells will be formed. Each memory cell can have a channel width that is defined by the horizontal dimension of a region 5, as will be illustrated further herein. In addition, each NVM segment will have a single bitline segment that is formed from conductive layer 12. The NVM segments in a common column will be connected to a common bitline with appropriate active and passive circuitry when the NVM array is complete.

Figure 3:
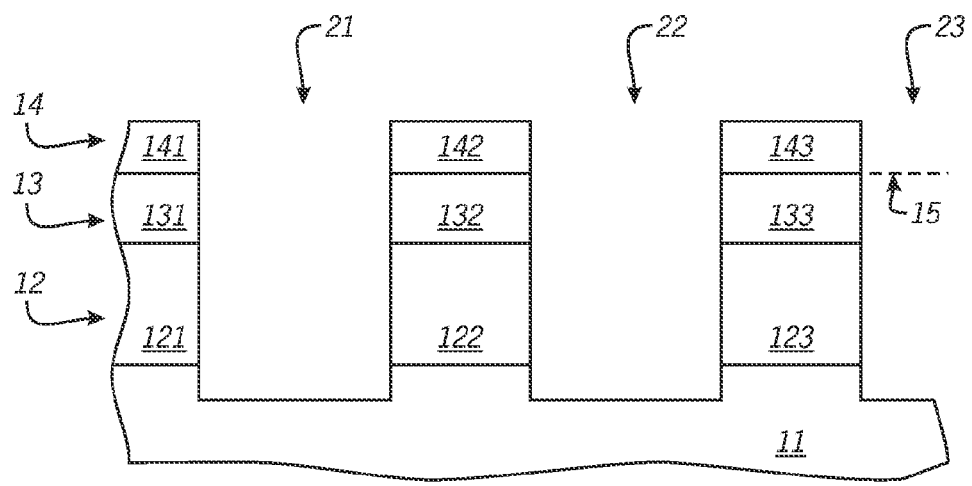
Figure 4:
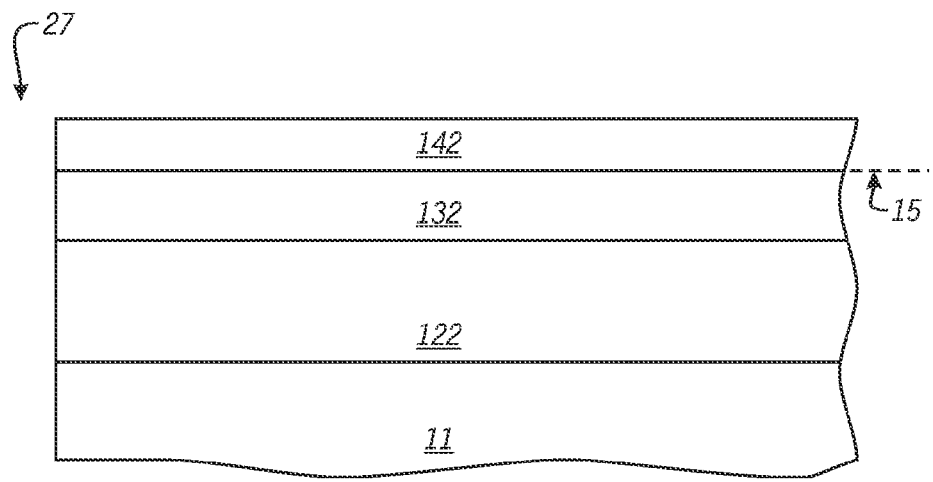

The technique used to form the trenches 21-23, and 26-27 can include a timed anisotropic etch to produce substantially vertical trench walls as illustrated at FIG. 3, which illustrates a cross-sectional view of the workpiece of FIG. 2 at cross-section line 3-3, and at FIG. 4, which illustrates a cross-sectional view of the workpiece of FIG. 2 at cross-section line 4-4. As illustrated at FIG. 3, the trenches 21-23 are spaced apart from each other, extend from the primary surface 15, and define sidewalls of the regions 5. The trenches 21-23 extend through n-doped layer 12 to a substantially uniform depth to form adjacent regions between the trenches that are isolated from each other where columns of nonvolatile memory cells will subsequently be formed. In one embodiment, the bottoms of each of the trenches 21-23 is defined by p-doped layer 11. If an SOI substrate is used, the bottoms of each of the trenches 21-23 will be defined by an insulator layer that underlies and abuts the n-doped layer 12.

A region 5 illustrated at FIG. 3 that is formed to the left of trench 21 includes a protective region 141 that is formed from the protective layer 14, a p-doped region 131 formed from the layer 13, and a conductive region 121 that is formed from the layer 12. A region 5 that is formed between the trench 21 and the trench 22 includes a protective region 142 that is formed from the protective layer 14, a p-doped region 132 formed from the layer 13, and a conductive region 122 that is formed from the layer 12. A region 5 that is formed between the trench 21 and the trench 22 includes a protective region 142 that is formed from the protective layer 14, a p-doped region 132 formed from the layer 13, and a conductive region 122 that is formed from the layer 12.

The conductive regions 121-123 of the workpiece are physically isolated from each other in a lateral dimension by formation of the vertical and horizontal trenches, and form bitline segments within respective regions 5. In addition, the illustrated conductive regions are electrically isolated from each other. For example, the conductive region 122 is electrically isolated from the conductive region 123 by trenches that include the trench 22, and by virtue of the layer 11 having an opposite conductivity type (p-doped) from that of conductive regions 122 and 123 (n-doped).

Figure 5:
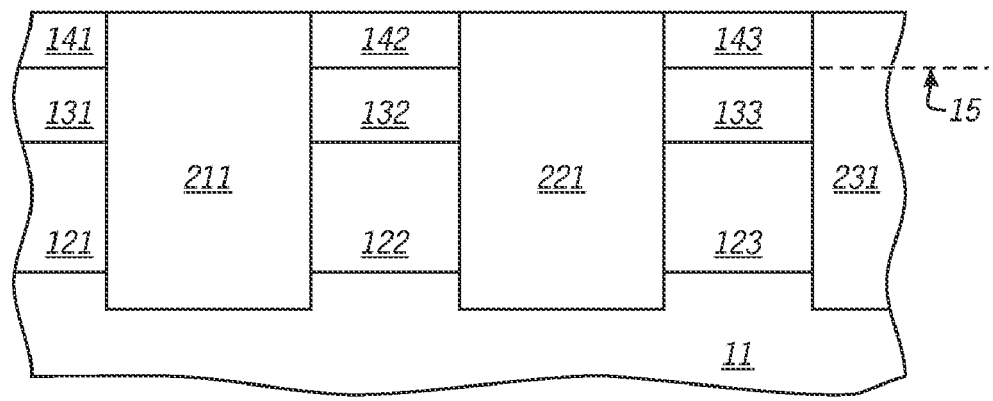
FIG. 5 includes an illustration of a cross-sectional view of the workpiece of FIG. 3 after the trenches have been filled with an insulating material in accordance with a specific embodiment of the disclosure.

Insulator regions are formed within the trenches 21-23 of the workpiece to form trench isolation regions 211, 221, and 231, respectively, as illustrated at FIG. 5. The insulator regions can be an insulator that fills the trenches, or can be an insulator that lines the trenches and is filled with a non-insulator, such as polysilicon. A conventional planarization technique can be used to provide a substantially planer upper-surface that includes protective regions 141-143.

Figure 6:
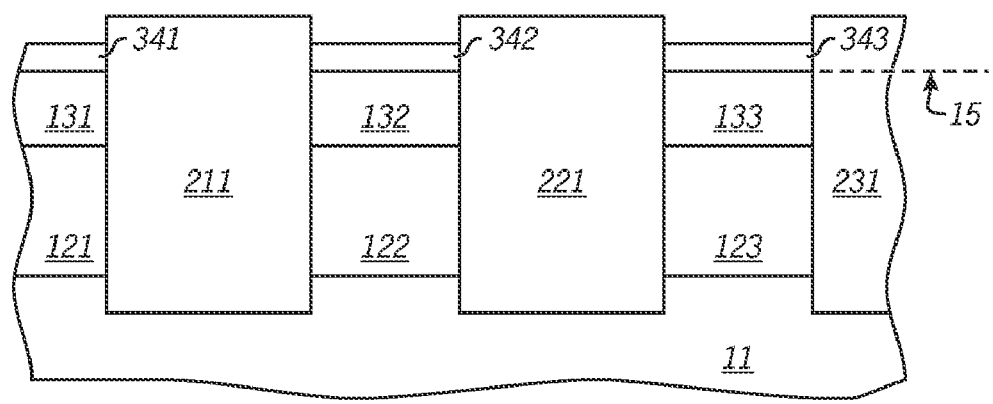
FIGS. 6-8 include illustrations of cross-sectional views of the workpiece of FIG. 5 after forming a floating gate structure in accordance with a specific embodiment of the disclosure.

The material of protective regions 141-143 of the workpiece is removed, as illustrated at FIG. 6, using a conventional technique to expose p-doped regions 131-133, which are cleaned using a conventional technique prior to forming overlying dielectric regions 341-343. Dielectric regions 341-343 can include an oxide, and will be used to form gate dielectric portions of gate structures for respective memory cells of the NVM array.

Figure 7:
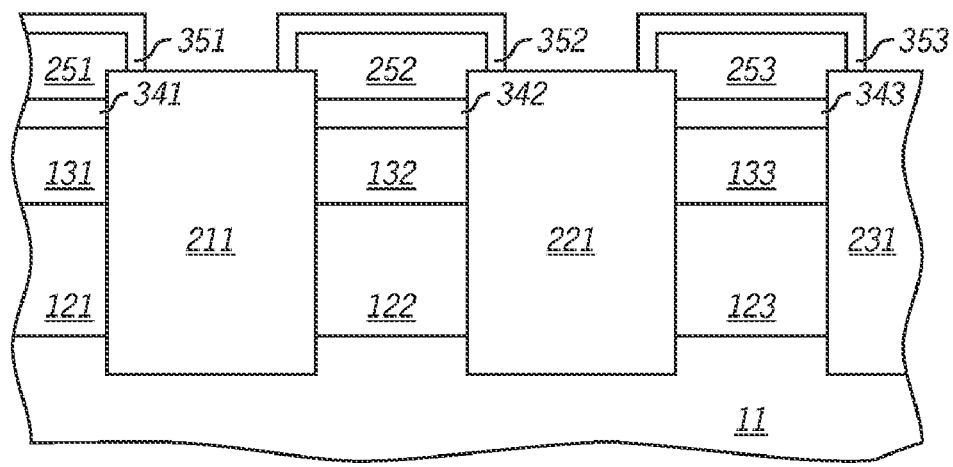
Figure 8:
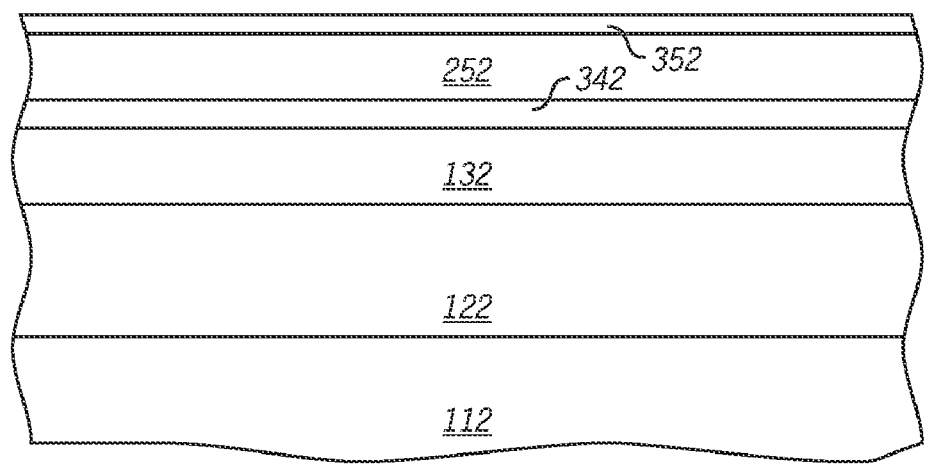

Charge storage regions are formed overlying dielectric regions 341-343 of the workpiece as illustrated by floating gate regions 251-253 at FIG. 7. In other embodiments, the charge storage regions can includes a nitride, nanocrystals, the like, and combinations thereof. According to a specific embodiment, the floating gate regions 251-253 can be poly-silicon containing a dopant and etched using a conventional technique, or poly-silicon that is deposited followed by a doping implantation step. In the embodiment illustrated at FIG. 7, the floating gate regions 251-253 have been formed in one direction along the vertical length of the array column being formed. Dielectric regions 351-353 have been formed over the floating gate regions 251-253. FIG. 8 illustrates a cross-sectional view of the workpiece of FIG. 7 along the length of the floating gate 252 at cross-section line 4-4 of FIG. 2. One skilled in the art will recognize that in an alternate embodiment, a dielectric layer and a charge storage layer can be formed over the layer 13 of FIG. 1, prior to the formation of the protective layer 14, to facilitate formation of the floating gate regions 251-253 at the same time that the trenches 21-22 are formed (FIG. 3), after which the dielectric regions 351-353 are formed.

Figure 9:
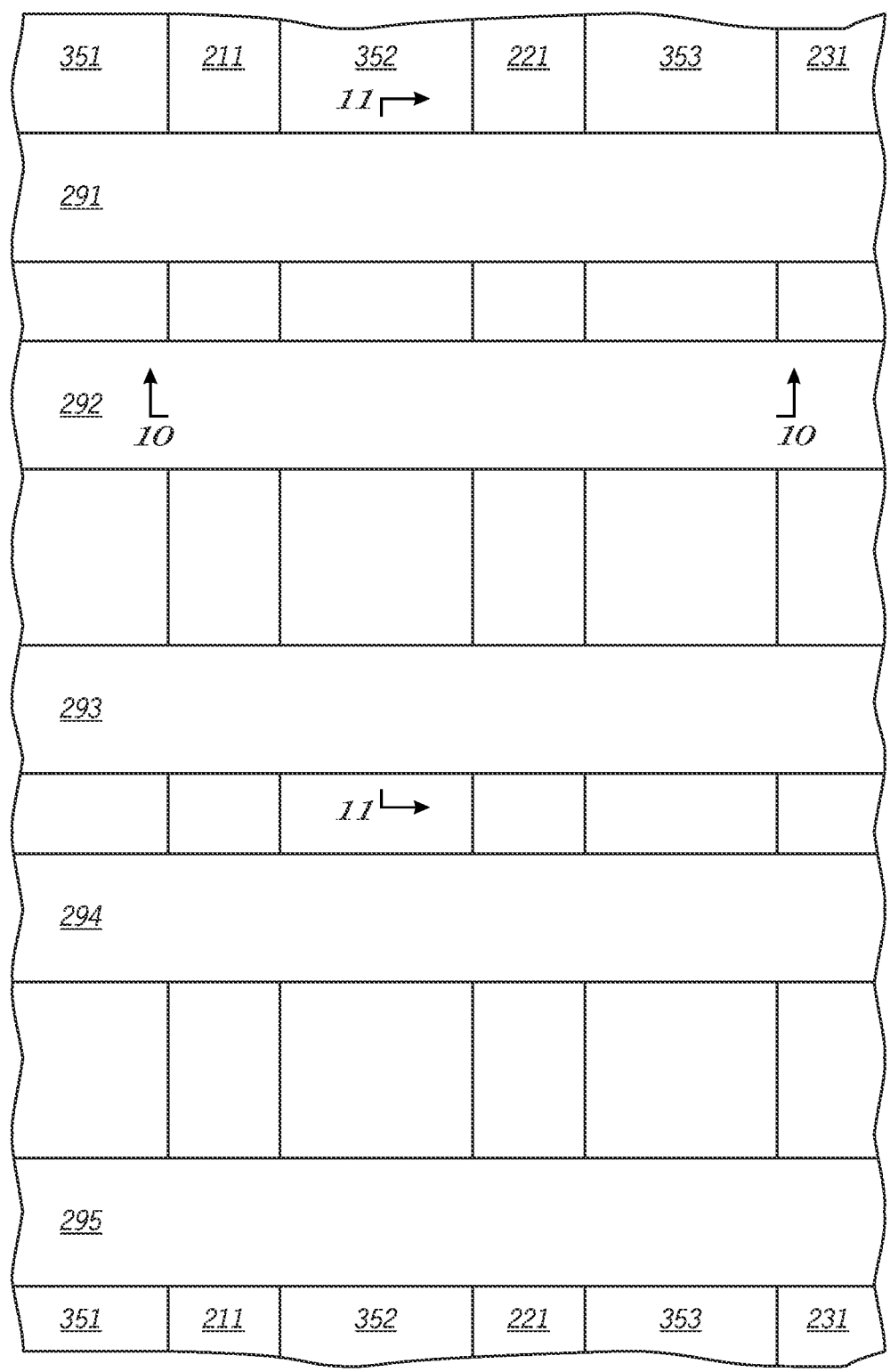
FIGS. 9-11 include illustrations from a top view and cross-sectional views of the workpiece of FIG. 7 after forming a conductive layer and a patterned layer in accordance with a specific embodiment of the disclosure.
Figure 10:
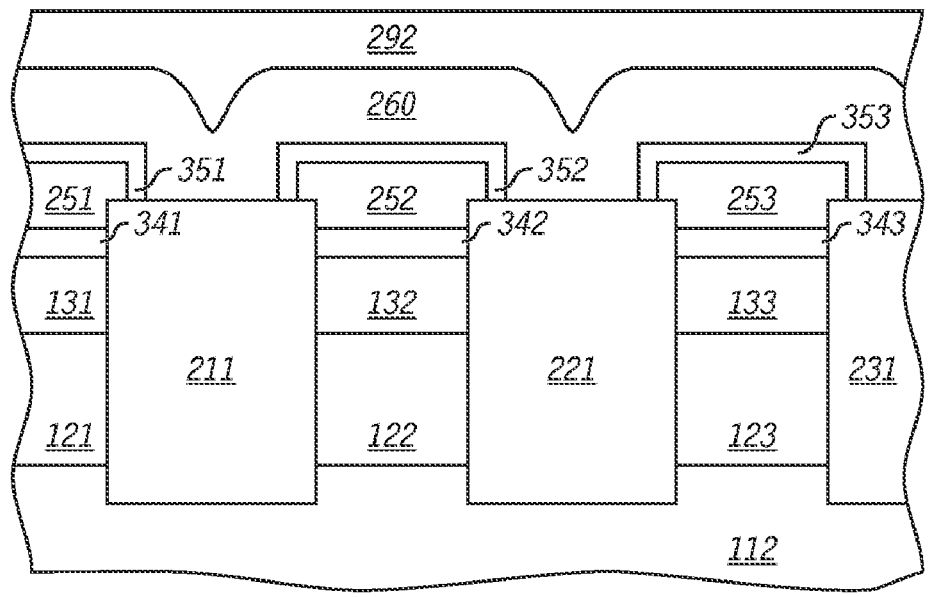
Figure 11:
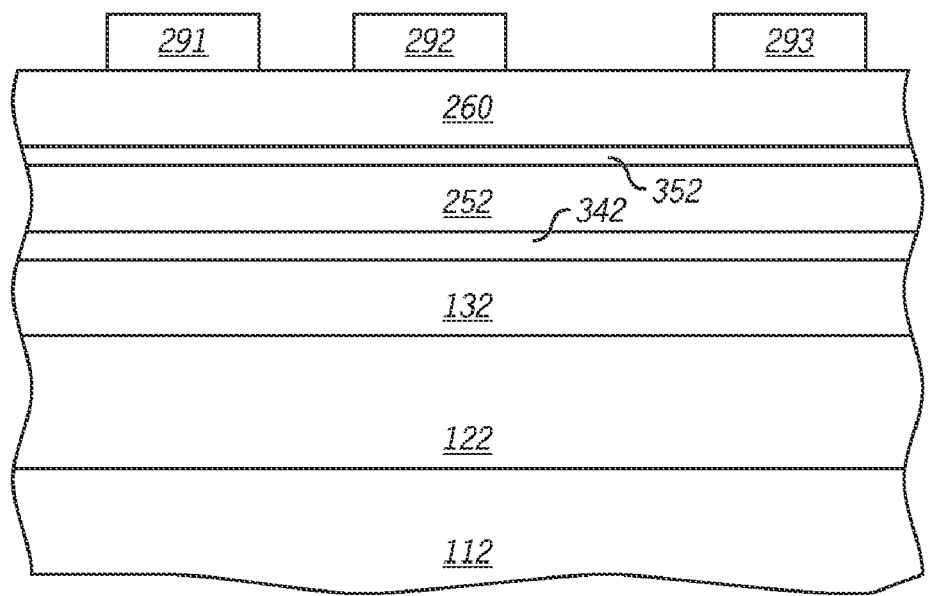

A conductive layer 260 and a patterned layer, such as a photoresist, that includes patterned regions 291-295 are formed overlying the workpiece as illustrated at FIGS. 9-11. FIG. 9 includes a top view of the workpiece that illustrates the spatial relationship between patterned regions 291-295 of the patterned layer and various other features, including dielectric regions 351-353 that overlie floating gates 251-253, respectively, and trench isolation regions 211, 221, and 231 (trench isolation regions 211-231) that are not overlaid by the dielectric regions 351-353. Note that portions of the dielectric regions 351-353 and trench isolation regions 211-231 underlying patterned region 291-295 are illustrated with dashed lines. The patterned regions 291-295 will be used to form conductive regions from conductive layer 260 that function as wordlines and associated control gates. The wordlines formed from conductive layer 260 will define rows of memory cells of the NVM array being formed. One of ordinary skill in the art will appreciate that the conductive layer 260 illustrated at FIG. 10, which extends across the entire workpiece of FIG. 9 between the patterned regions 291-295 and the dielectric regions 351-352 is not illustrated in FIG. 9.

FIG. 10 is the cross-sectional view of the workpiece of FIG. 9 at cross-section line 10-10, and illustrates patterned region 292 of a patterned layer overlying conductive layer 260. FIG. 11 illustrates cross-sectional view at the location indicated by cross-section line 11-11 of the workpiece of FIG. 9 and includes patterned regions 291-293 of the patterned layer. In one embodiment, conductive layer 260 is doped polysilicon and can have a dopant concentration of at least approximately 1E19 atoms/cm**3. In another embodiment, conductive layer 260 includes a metal.

Figure 12:
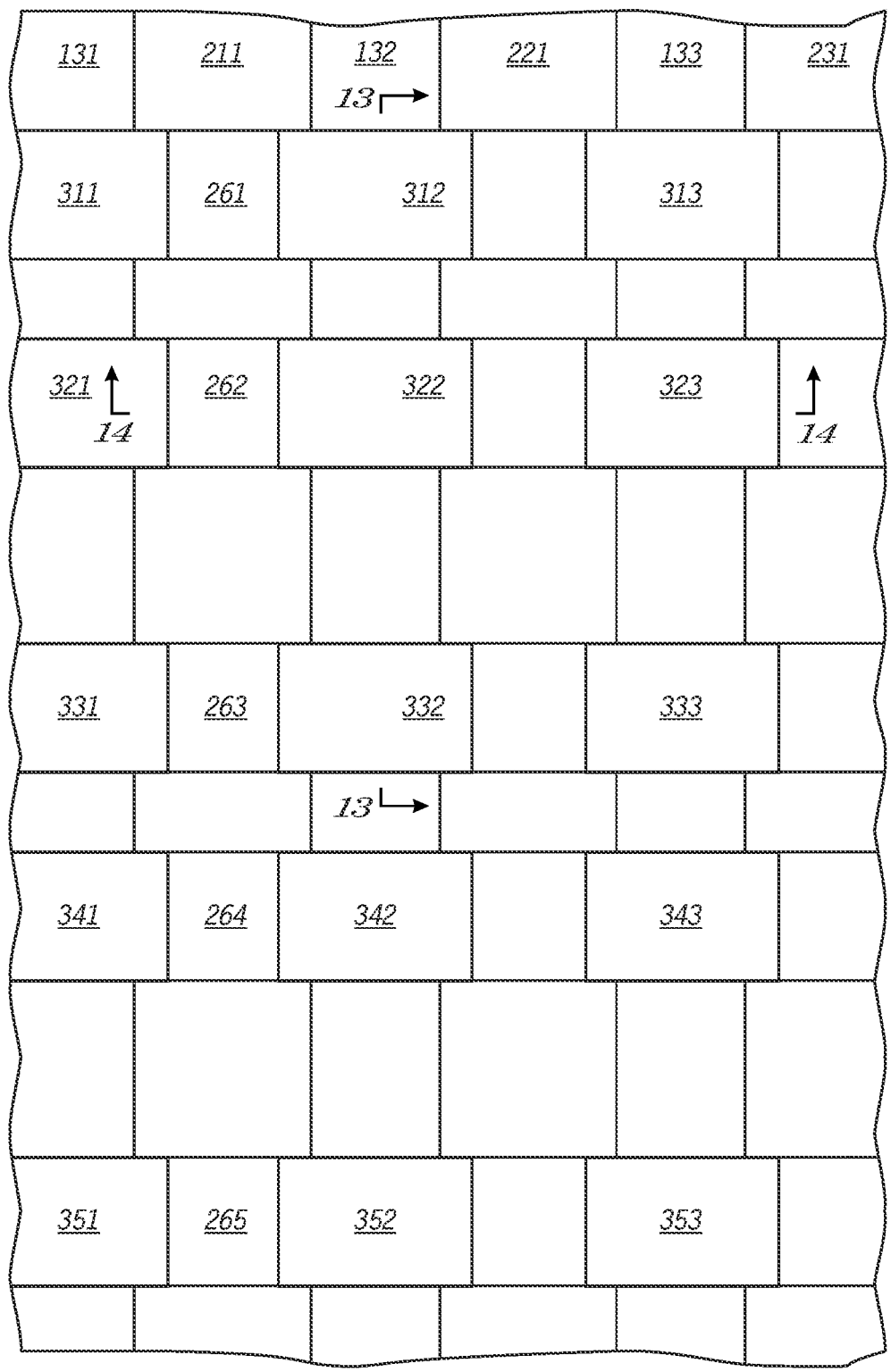
FIGS. 12-14 include illustrations from a top view and cross-sectional views of the workpiece of FIG. 10 after forming well regions in accordance with a specific embodiment of the disclosure.

Conductive regions are formed by removing portions of conductive layer 260, which are not protected by the patterned layer that includes patterned regions 291-293. Each conductive region forms a wordline and a plurality of control gates for memory cells being formed For example, FIG. 12 includes a top view of the workpiece of FIGS. 9-11 and illustrates conductive regions 261-265 that correspond to wordlines formed from conductive layer 260. In addition, FIG. 12 illustrates the location of gate structures 311-313, 321-323, 331-333, 341-343, and 351-353 that are formed by removal of portions of dielectric regions 351-353, and floating gate regions 251-252 that are not protected by patterned regions 291-295. Active regions, which correspond to portions of regions 5 (FIG. 2), are exposed by removing portions of dielectric regions 341-343 that are not protected by the patterned regions 291-295.

Figure 13:
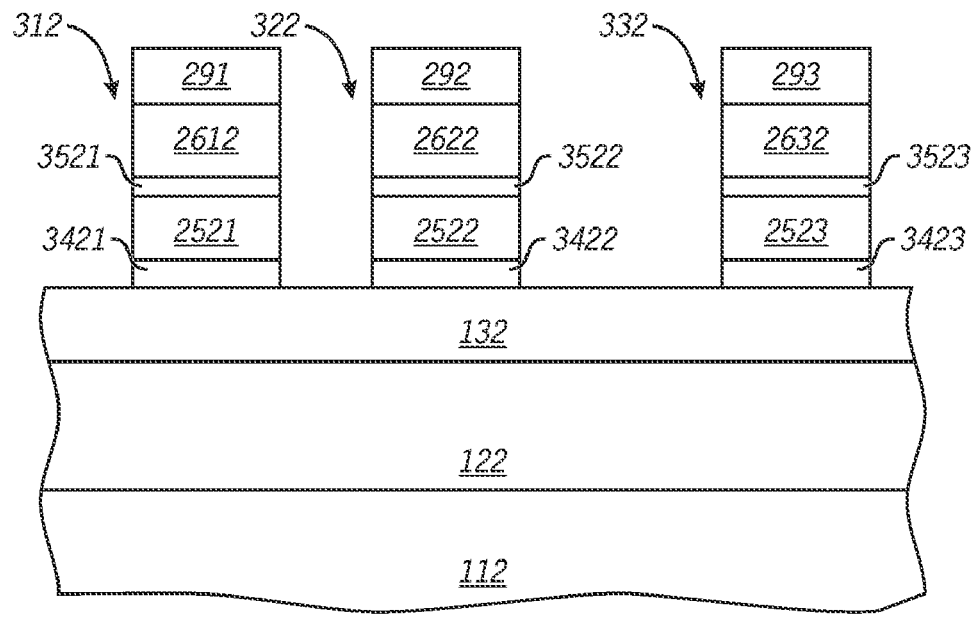

FIG. 13 illustrates a cross-sectional view of the workpiece of FIG. 11 after removal of portions of the conductive layer 260, the dielectric regions 351-353, the floating gate regions 251-252, and the dielectric regions 341-343 that are not protected by protective features 291-295, as a result gate structures 312, 322, and 332 (gate structures 312-332) have been formed. The gate structure 312 includes gate dielectric 3421 formed from dielectric region 342, floating gate 2521 formed from floating gate region 252, inter-gate dielectric 3521 formed from dielectric region 352, and control gate 2612 that is a portion of the conductive region 261. The gate structure 322 includes gate dielectric 3422 formed from dielectric region 342, floating gate 2522 formed from floating gate region 252, inter-gate dielectric 3522 formed from dielectric region 352, and control gate 2622 that is a portion of a conductive region 262. The gate structure 332 includes gate dielectric 3423 formed from dielectric region 342, floating gate 2523 formed from floating gate region 252, inter-gate dielectric 3523 formed from dielectric region 352, and control gate 2632 a portion of a conductive region 263.

Figure 14:
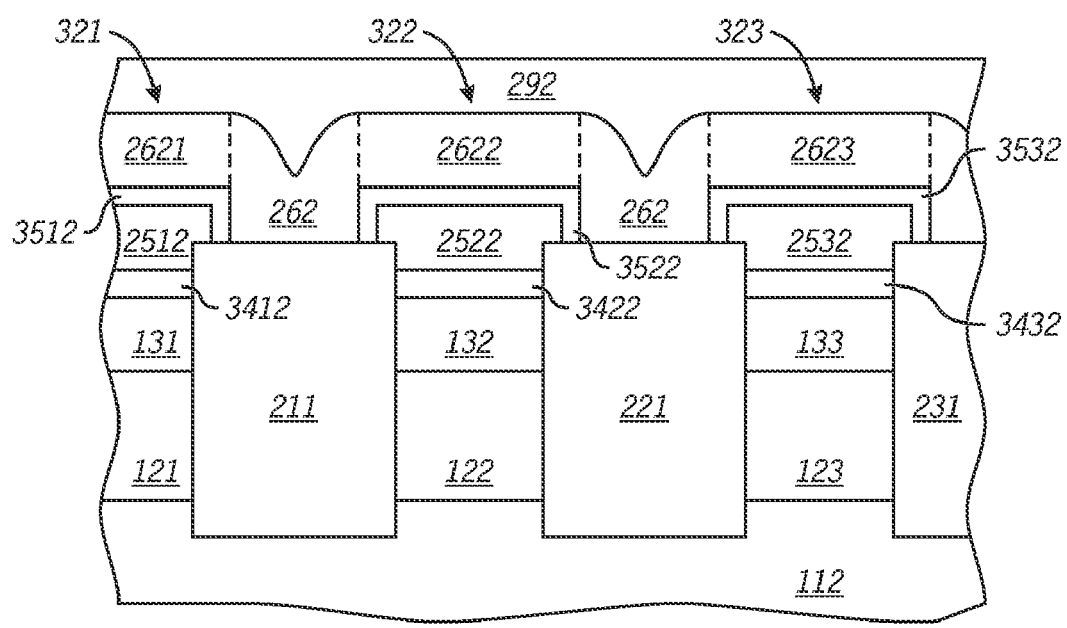

As noted above, each of conductive regions 261-265 implements a corresponding wordline and a plurality of conductive gates for a row of memory cells. For example, FIG. 14 illustrates a cross-sectional view of conductive region 262 of the workpiece of FIG. 12 at a cross-sectional view corresponding to that of FIG. 10, where conductive region 262 forms a wordline, a conductive gate 2621 for the gate structure 321, a conductive gate 2622 for the gate structure 322, and a conductive gate 2623 for the gate structure 323.

Figure 15:
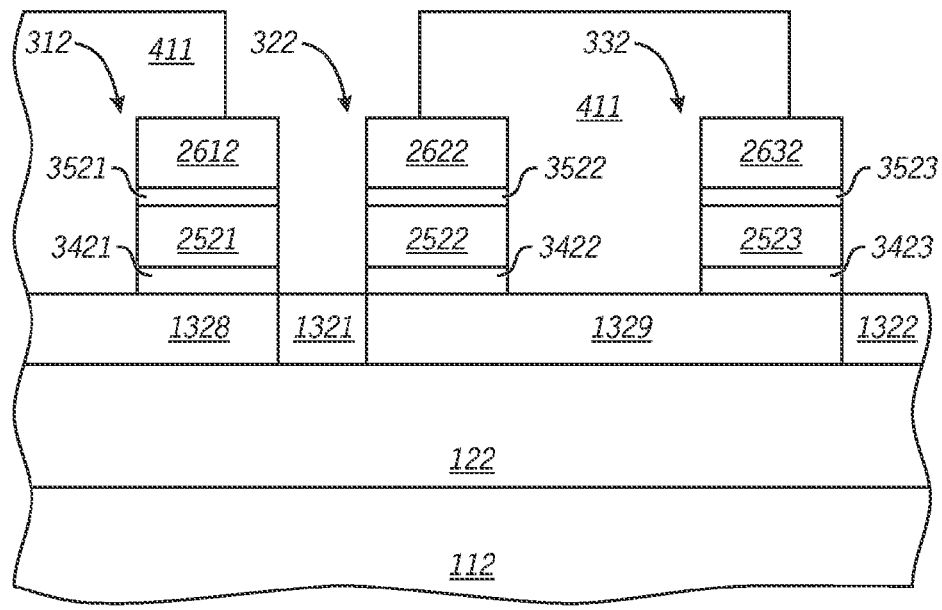
FIG. 15 includes an illustration of a cross-sectional view of the workpiece of FIG. 13 after forming a doped region in accordance with a specific embodiment of the disclosure.

Referring to FIG. 15, the patterned regions 291-293 have been removed, and a protective layer 411, which can be a resist material, is formed having openings that expose locations where drain regions and connections between drain regions and the conductive region 122 are to be formed. In accordance with the present embodiment, the exposed locations are implanted with an n-type dopant to form an n-doped region 1321 and an n-doped region 1322. N-doped regions 1321 and 1322 are formed to extend through p-doped region 132 to conductive regions 122 and act as shared drains for adjacent memory cells, and as a buried interconnect to electrically connect their corresponding shared drains to the conductive region 122, which operates as a buried bitline segment. As a result of the formation of n-doped region 1321, p-type doped region 132 of the workpiece of FIG. 13 is partitioned into p-type body regions that are physically isolated from one another, i.e., spaced apart from each other, at the workpiece of FIG. 15. For example, as illustrated in FIG. 15, body regions 1328 and 1329 have been formed from p-doped region 132 and are spaced apart from each other by formation of n-doped region 1321.

N-doped region 1321 includes a shared drain region, which is associated with the gate structure 312 and the gate structure 322, and a buried interconnect region that electrically connects the shared drain region to the conductive region 122. For example, doped region 1321 is electrically connected to conductive region 122 by virtue of both regions having the same conductivity type (n-type). Conversely, the body region 1328 is not electrically connected to the body region 1329 at the level of the body regions because the conductivity type of the doped region 1321, which is between body region 1329 and body region 1329, is opposite the conductivity type of the body regions 1328 and 1329. Doped region 1321 can have a doping concentration in the range of approximately 1E15-1E21 atoms/cm3, such as in the range of approximately 1E18-1E19 atoms/cm3. Doped region 1322 includes a shared drain region that is associated with the gate structure 332 and an adjacent gate structure (not shown), and a buried interconnect region that electrically connects the shared drain region to the conductive region 122.

Figure 16:
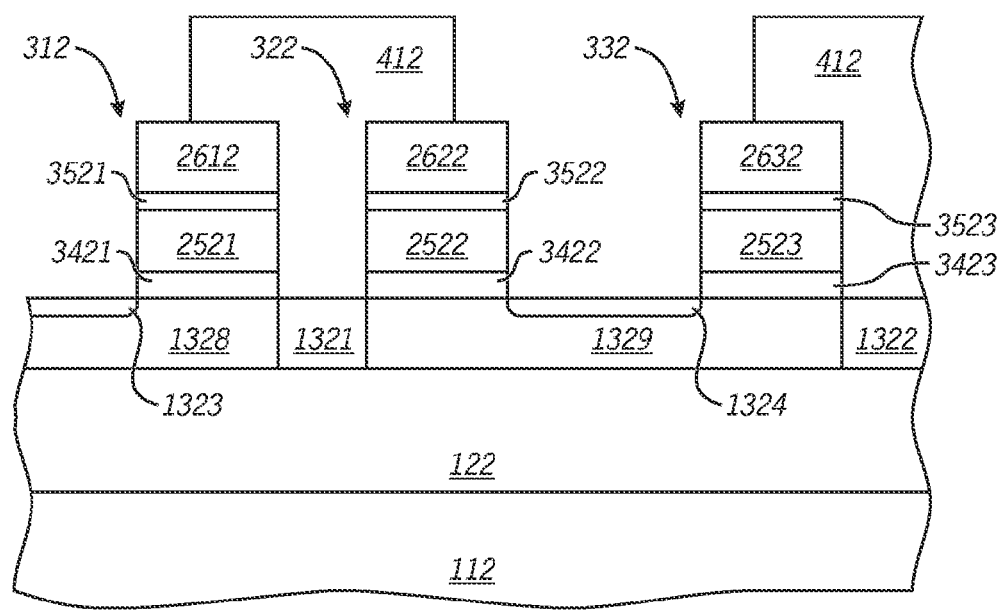
FIG. 16 includes an illustration of a cross-sectional view of the workpiece of FIG. 15 after forming a doped region in accordance with a specific embodiment of the disclosure.

The protective layer 411 is removed from the workpiece, as illustrated at FIG. 16, and another protective layer, such as a photo resist layer, is formed and patterned overlying the workpiece as illustrated by patterned layer 412. Patterned layer 412 exposes locations where source regions, and connections between the source regions and their respective body regions, are to be formed. The locations exposed by patterned layer 412 are implanted with an n-type dopant to form n-doped regions, such as an n-doped region 1323 and an n-doped region 1324 of FIG. 17 which can form either lightly doped drain (LDD) regions or source regions. In the embodiment illustrated a FIG. 16 the n-doped regions 1323 and 1324 are LDD regions and can have a dopant concentration in a range of approximately 1E15-1E19 atoms/cm3, such as approximately 1E18 atoms/cm3, when forming a lightly doped drain region.

Figure 17:
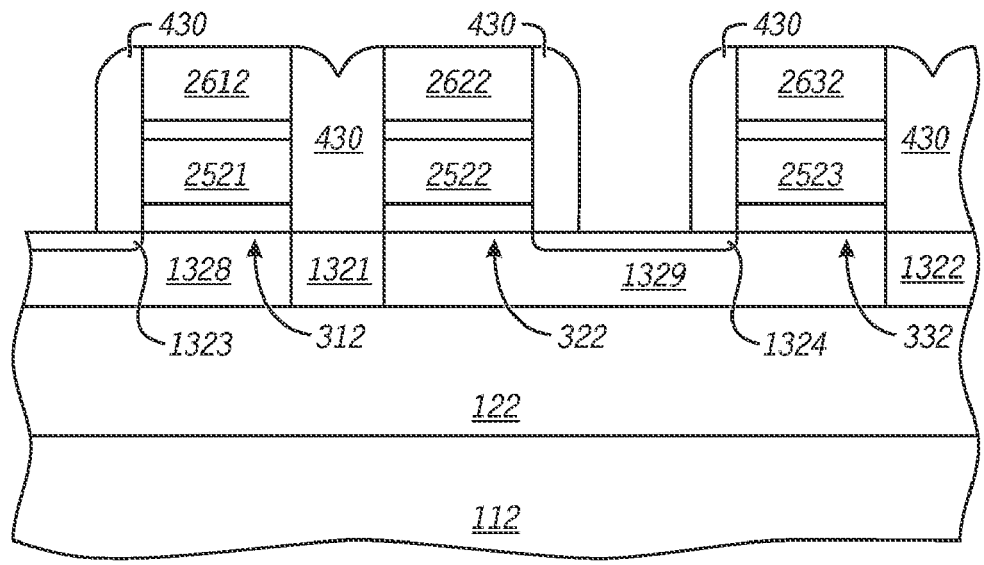
FIG. 17 includes an illustration of a cross-sectional view of the workpiece of FIG. 16 after forming a source region and sidewall spacers in accordance with a specific embodiment of the disclosure.

After formation of the doped regions 1323 and 1324, masking layer 412 is removed, and a source region can be formed at a location defined by either masks or spacers. FIG. 17 illustrates a specific embodiment after forming sidewall spacers 430 formed adjacent the sidewalls of the gate structures 312-332. In the embodiment illustrated at FIG. 17, the material forming the sidewall spacers 430 includes a nitride or other material that facilitates selective etching of an inter-level dielectric to be discussed further herein. The thickness of the sidewall spacer 430 in the lateral dimension can be chosen based upon the spacing between the gate structure 312 and the gate structure 322. For example, the thickness of a layer used to form the sidewall spacers 430 is chosen such that after being formed the sidewall spacers 430 completely cover the shared drain regions 1321 and 1322, but only partly cover the location where the source regions are being formed. Thus, the thickness of the layer used to form the sidewall spacers 430 is at least one-half the distance between the gate structure 312 and the gate structure 322. As illustrated at FIG. 17, the spacing between the gate structure 322 and the gate structure 332 has been chosen such that an opening remains between the sidewall spacers 430 on the source side of the gate structures, and no opening remains between the sidewall spacers on the drain side of the gate structures.

Figure 18:
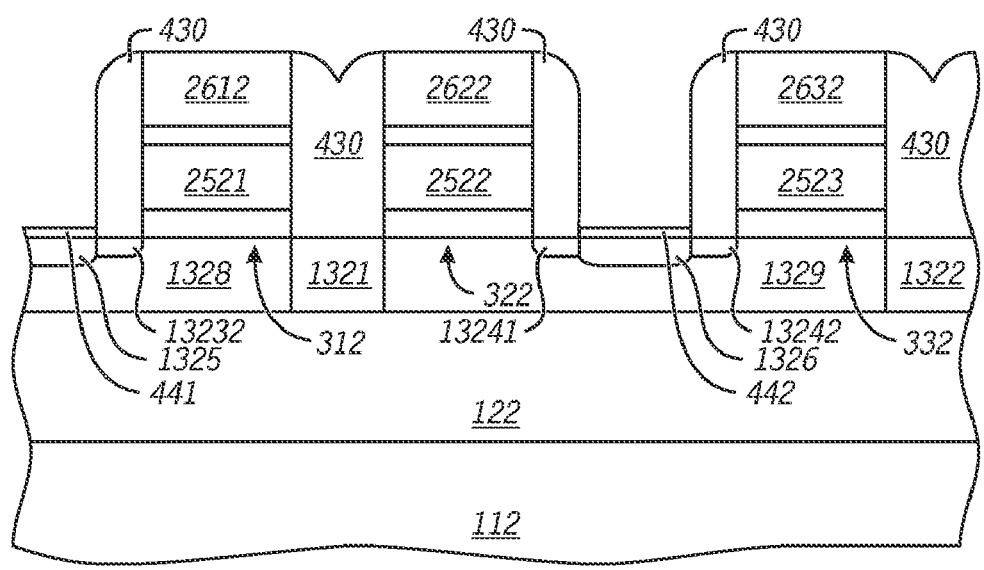
FIG. 18 includes an illustration of a cross-sectional view of the workpiece of FIG. 17 after forming a doped region in accordance with a specific embodiment of the disclosure.

Source regions and silicide regions are formed at the exposed locations of workpiece between the gate structure 322 and the gate structure 332 as illustrated at FIG. 18 by source region 1325 and source region 1326, and silicide region 441 and silicide region 442. Forming region 1235 results in an LDD region 13232 that is associated with gates structure 312, an LDD region 13241 that is associated with gates structure 322, and an LDD region 13242 that is associated with gates structure 332. The dopant concentration of source regions 1325 and 1326 are typically in the range of approximately 1E18 atoms/cm3 to 2E19 atoms/cm3, such as approximately 1E19 atoms/cm**3. The silicide regions 441 and 442 are formed from a material capable of reacting with silicon such as Ti, Ta, Co, W, Mo, Pt.

Figure 19:
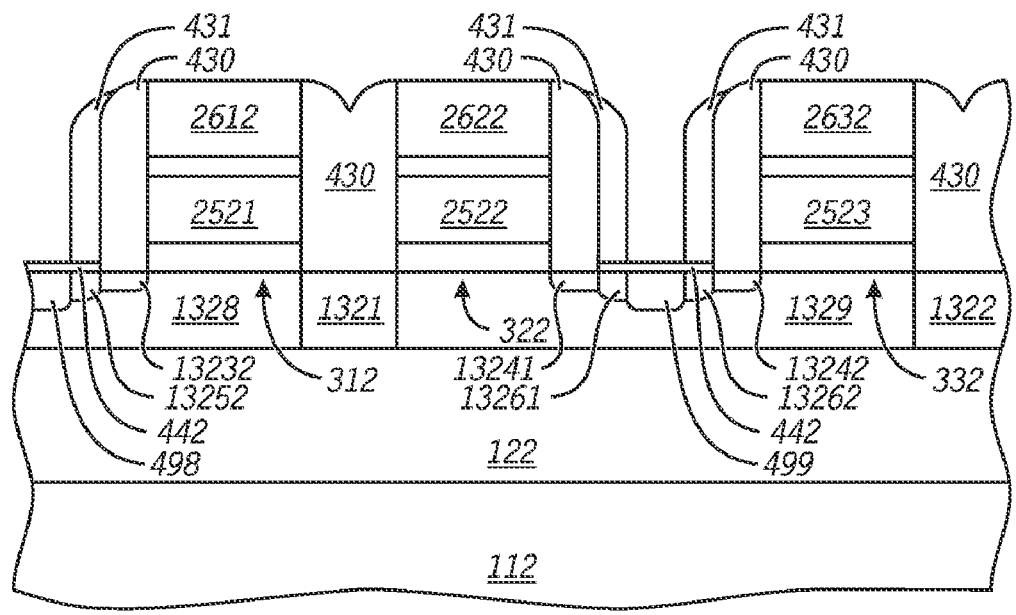
FIG. 19 includes an illustration of a cross-sectional view of the workpiece of FIG. 18 after forming a tie region in accordance with a specific embodiment of the disclosure.

Tie regions 498 and 499 that electrically connect the source regions of each memory cell to its body region are formed at the workpiece as illustrated at FIG. 19. The tie regions 498 and 499 can be formed by implanting a p-type dopant at locations of the source regions that electrically connects the body region 1328 to silicide region 441, and body region 1329 to silicide region 442. The locations where the tie regions 498 and 499 are formed can be defined by a sacrificial patterned layer, such as a resist mask (not illustrated), or by forming additional sidewall spacers that abut sidewall spacers 430, as illustrated by sidewall spacers 431. Subsequent to formation of sidewall spacers 431, tie region 498 and tie region 499 are formed by implanting a sufficient amount of a p-type dopant to compensate for the n-type dopant concentration of the source and LDD regions to form tie regions 498 and 499 having a dopant concentration in the range of approximately 1E18 atoms/cm3 to 9E19 atoms/cm3, such as approximately 7E18/cm3. Tie region 498 results in source regions 13251 (not illustrated) and 13252 being formed from doped region 1325. Tie region 499 results in source regions 13261 (not illustrated) and 13262 being formed from doped region 1326. Tie regions 498 and 499 have a p-type conductivity, are aligned to the sidewall spacers 431**, and electrically connect the source regions of each memory cell to its body region.

Figure 20:
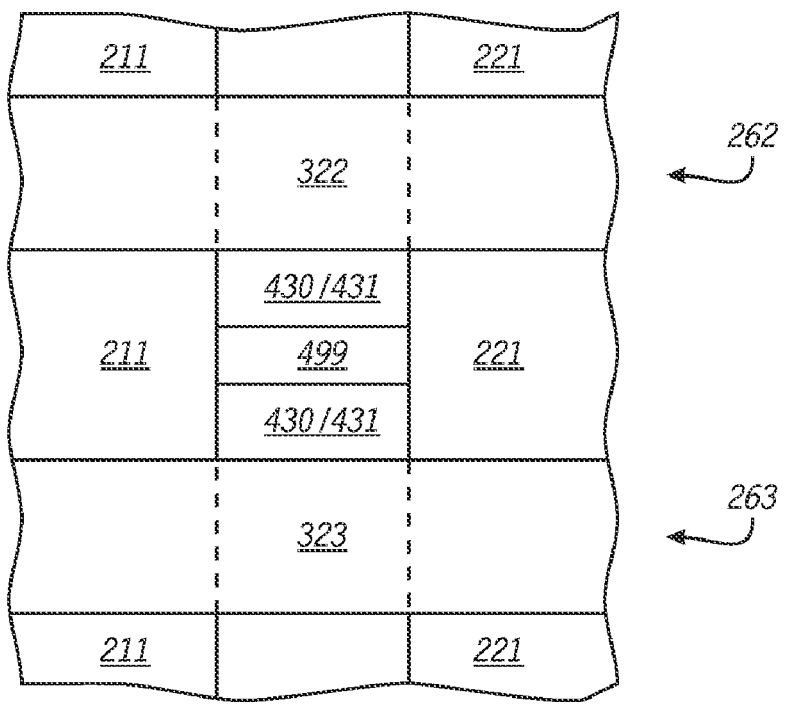
FIG. 20 includes an illustration of a top view of a portion of the workpiece that includes the cross-section location of FIG. 19 in accordance with a specific embodiment of the disclosure.

FIG. 20 illustrates from a top view a portion of the workpiece of FIG. 19 that includes portions of conductive regions 262 and 263 of gate structures 322 and 323, and locations of the corresponding sidewall spacers and tie regions.

Figure 21:
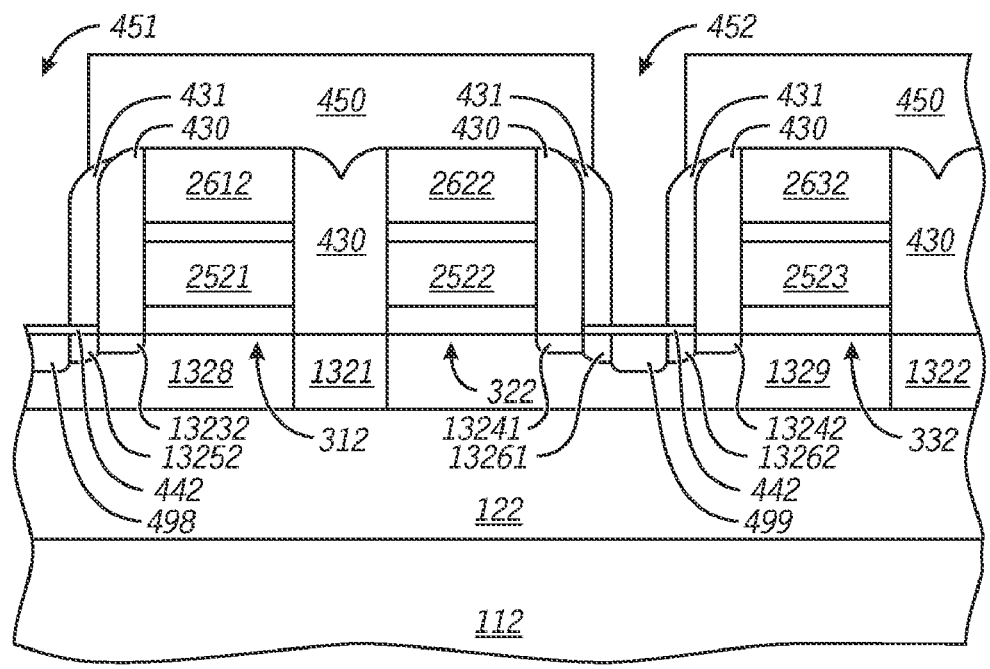
FIG. 21 includes an illustration of a cross-sectional view of the workpiece of FIG. 19 after forming of an inter-level dielectric in accordance with a specific embodiment of the disclosure.

An interlevel dielectric layer is formed overlying the workpiece, such as patterned layer 450 of FIG. 21 that defines, and will isolate, locations of the workpiece of FIG. 19 where contacts to the source regions of the gate structures are to be formed. The patterned layer 450 can include an insulating material. The materials of patterned layer 450 and sidewalls 431 are chosen such that the patterned layer can be selectively etched without significantly affecting the sidewall 431. This allows the contact openings 451 and 452 to terminate on the sidewall structures 431, allowing subsequently formed contacts that will electrically connect the source-side silicides to overlying metal interconnects to be defined by the space between the sidewall structures 431. For example, referring to FIG. 21, the patterned layer 450 terminates at sidewall structures 431 between gate structures 322 and 332 to create an opening 452 above the silicide region 442 that is defined by the sidewalls of both the sidewall spacers 431 and the patterned layer 450.

One skilled in the art will appreciate that tie regions between the source and body can be formed using a variety of different methods. For example, after the first source implant of FIG. 16, source-side spacers can be formed that define a location where a body tie diffusion is to be implanted between two memory cells. After implanting the body tie diffusion, the source-side spacers are etched back to define the location where a second source implant is to occur. In this manner, both the body tie implant and the second source implant, if used, are aligned to the source-side spacers.

Figure 22:
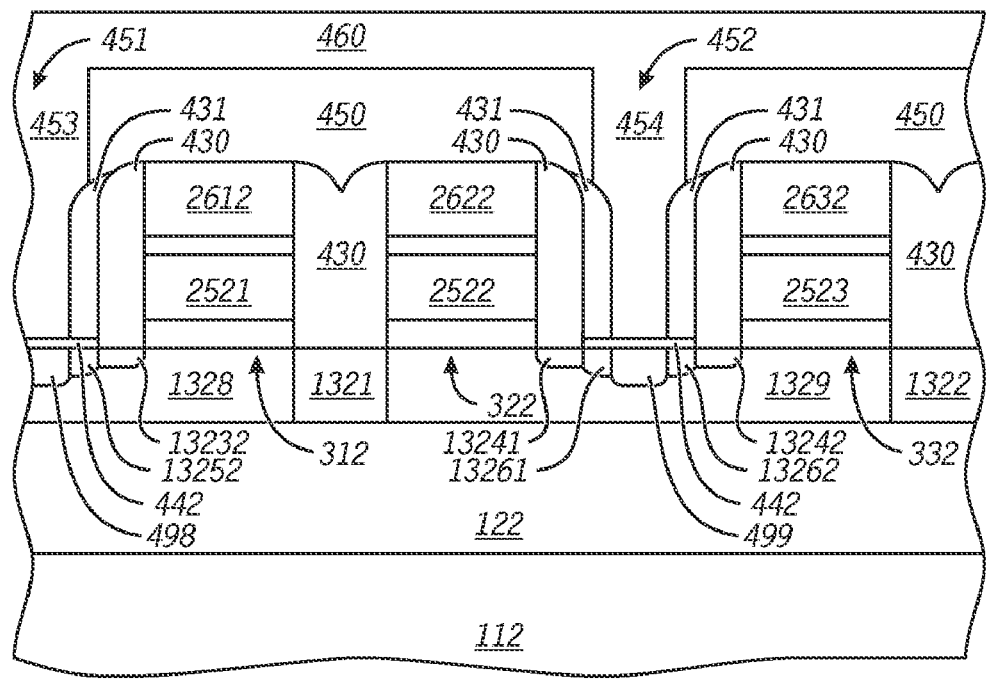
FIG. 22 includes an illustration of a cross-sectional view of the workpiece of FIG. 21 after forming a conductive contact in accordance with a specific embodiment of the disclosure.

FIG. 22 illustrates the workpiece after forming contacts 453 and 454 within openings 451 and 452 (FIG. 18) using conventional techniques. A conductive line 460 is formed overlying and in electrical contact with the contacts 453 and 454. In one embodiment, contacts 453 and 454 are formed prior to conductive line 460, and a conductive layer (not illustrated) is formed over patterned layer 450 and substantially fills contact openings therein. In another embodiment, the conductive line 460 and contacts 453 and 454 are formed concurrently as part of a dual in-laid process.

Figure 23:
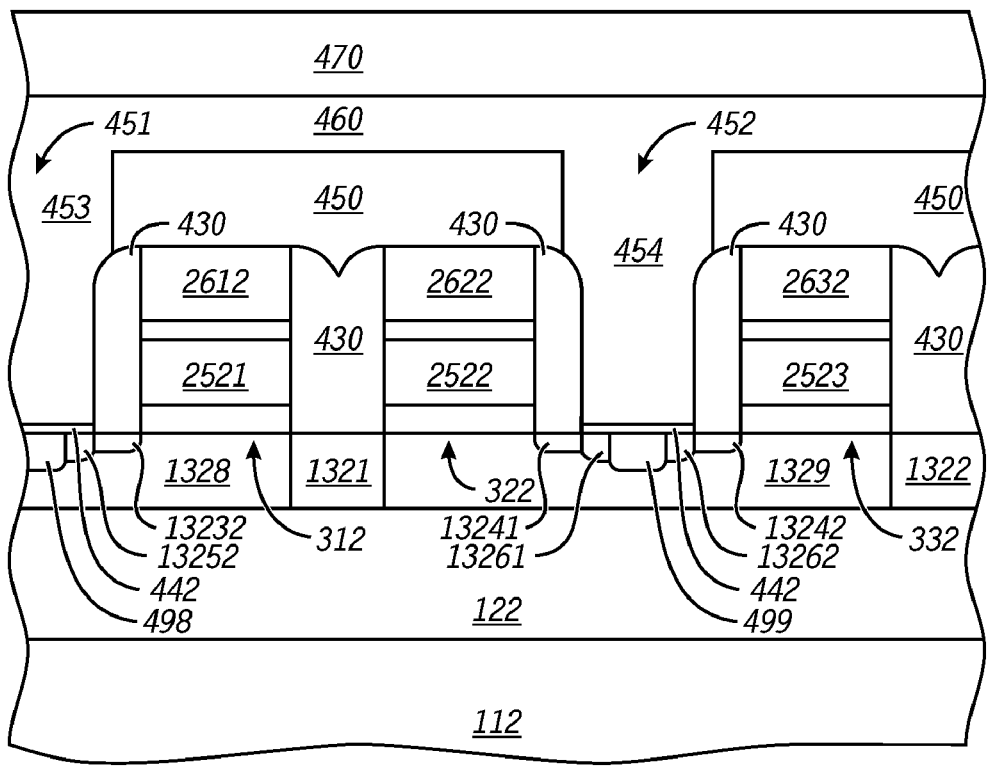
FIG. 23 includes an illustration of a cross-sectional view of the workpiece of FIG. 22 after forming a passivation layer in accordance with a specific embodiment of the disclosure.

In another embodiment (not illustrated), additional insulating and conductive layers can be formed and patterned to form additional levels of interconnects. After the last interconnect level has been formed, passivation layer 470 is formed over the substrate 10, including the NVM array and peripheral areas, as illustrated at FIG. 23.

Figure 24:
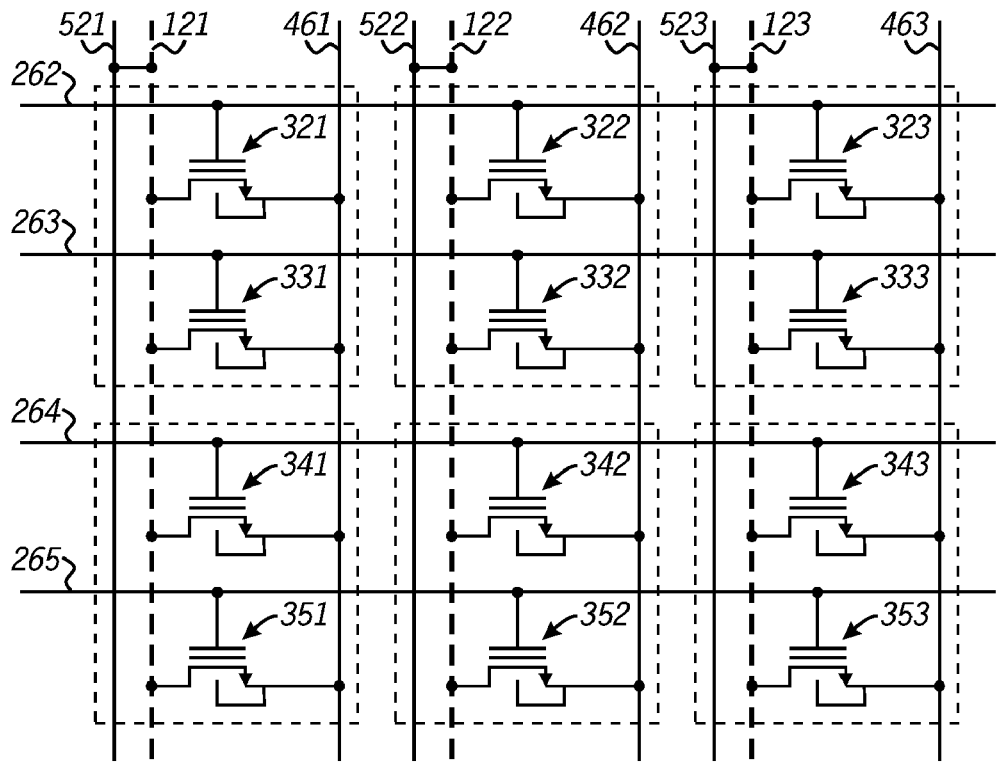
FIG. 24 includes an illustration of a schematic of a portion of a memory array in accordance with a specific embodiment of the disclosure.

FIG. 24 illustrates a schematic diagram of a portion of the NVM array that includes memory cells 321-323, 331-333, 341-343, and 351-353 that define portions of four rows and three columns of the NVM array. Memory cells that share a common body region, such as memory cells 322 and 332, are identified by a dashed box. Each memory cell has a control gate electrode connected to one of wordlines 262-265, a drain electrode connected to one of the conductive regions 121-123 (bitline segments), and a source electrode/body connected to one of the source lines 461-463. The conductive regions 121-123 are illustrated as dashed lines to indicate their buried nature as described above. Each of the conductive regions 121-123 are connected to a corresponding bitline 521-523. Only one electrical connection is needed between each one of conductive regions 121-123 and its corresponding bitline. One skilled in the art will appreciated that each of the memory cells illustrated at FIG. 24 that are connected to conductive region 121 are associated with a come region 5 (FIG. 2), and that each other region 5 within the same column will also have a bitline segment that is connected to bitline 521. Each of the memory cells illustrated at FIG. 24 that are connected to conductive region 122 are associated with a single region 5 (FIG. 2), and that each other region 5 within the same column will also have a bitline segment that is connected to bitline 522. Each of the memory cells illustrated at FIG. 24 that are connected to conductive region 123 are associated with a single region 5 (FIG. 2), and that each other region 5 within the same column will also have a bitline segment that is connected to bitline 523.

FIG. 25 includes a table that has some typical operating voltages for the memory cells, illustrated in FIG. 24. One skilled in the art will appreciate that the operating voltages can vary from the values listed in that they represent typical values. Values in the columns labeled Vcg262 and Vcg263 correspond to voltages at wordlines 262 and 263, respectively. Values in the columns labeled Vs461 and Vs462 correspond to the voltages at source lines 461 and 462. Values in the columns labeled Vd121 and Vd122 correspond to the voltages at bitlines 521 and 522. The row labeled "Erase 321/322 (FN/Vtl)" includes operating voltages used to erase memory cells 321 and 322 simultaneously to a low voltage threshold using Fowler-Nordheim tunneling. The row labeled "Pgm 321 (HCI/Vth)" includes operating voltages used to program memory cell 321 to a high voltage threshold using hot carrier injection. The row labeled "Erase 321/322 (FN/Vth)" includes operating voltages used to erase memory cells 321 and 322 simultaneously to a high voltage threshold using Fowler-Nordheim tunneling. The row labeled "Pgm 321 (FN/Vt)" includes operating voltages used to program memory cell 321 to a low voltage threshold using Fowler-Nordheim tunneling. The row labeled "Read 321-323" includes operating voltages used to read all memory cells on a given work line at the same time. The voltage Vph will typically be in the range of 12-20 volts. The voltage Vinh will typically be in the range of 2-8 volts. The voltage Vread will typically be in the range of 1-5 volts. At the row labeled "Pgm 321 (HCI/Vth)" the voltage Vd122 is used for the source line and drain line of the memory cell not being programmed by HCI to indicate that the source and drain lines are maintained at about the same voltage. At the row labeled "Read 321-323" the voltage >Vs461 is used to indicated that the drain line of the rows being read are maintained at a higher voltage than the source lines.

One skilled in the art will recognize that each of the source lines can be driven to different voltages during a program or erase operation to vary the rate at which each memory cell's voltage threshold is modified. In addition, one skilled in the art will appreciate that the voltage drop along the bitline segment during a read operation does not significantly affect the read margin of the memory cell. This is advantageous over an implementation where the source/body regions of the memory cells of an array segment are electrically connected along a common source line segment within a memory array segment, especially if the common source line segment is subject to a voltage drop along it length.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include providing a substrate that includes a conductive region. The process can also include forming a first gate structure overlying a first body region at a location where a first memory cell of a nonvolatile memory array is being formed, wherein the first body region is between the first gate structure and the conductive region. The process can further include forming a second gate structure overlying a second body region at a location where a second memory cell of the nonvolatile memory array is being formed, wherein the second body region is between the second gate structure and the conductive region. The process can still further include forming a first drain region overlying and electrically connected to the conductive region, the first drain region being associated with the first gate structure. The process can still further include forming a second drain region overlying and electrically connected to the conductive region, the second drain region being associated with the second gate structure.

In an embodiment of the first aspect, the first and second drain regions can include a shared drain region. In another embodiment of the first aspect, the first and second drain regions can be spaced apart from each other. In another embodiment of the first aspect, the conductive region, the first drain region, and the second drain region can have a first conductivity type, and the first body region and the second body region can have a second conductivity type that is opposite the first conductivity type. In another embodiment of the first aspect a first region of the first conductivity type electrically can connect the first drain region and the conductive region to each other.

In another embodiment of the first aspect the second body region can be physically isolated from the first body region, and the process can further include forming a first source region overlying the conductive region and electrically connected to the first body region, the first source region being associated with the first gate structure, and forming a second source region overlying the conductive region and electrically connected to the second body region, the second source region being associated with the second gate structure. In a further embodiment of this particular embodiment the first body region and the second body region can have a second conductivity type and abut the conductive region, and the second conductivity type can be opposite the first conductivity type.

In another embodiment of the first aspect, the conductive region can be a first conductive region, and the substrate can further include a second conductive region that as viewed from a top view is spaced apart from the first conductive region by an insulator region, and the process can further include forming a third gate structure overlying a third body region at a location where a third memory cell of the nonvolatile memory array is being formed, wherein the third body region can be between the third gate structure and the second conductive region. The process of this particular embodiment can still further include forming a fourth gate structure overlying a fourth body region at a location where a fourth memory cell of the nonvolatile memory array is being formed, wherein the fourth body region is between the fourth gate structure and the second conductive region. The process of this particular embodiment can still further include forming a third drain region overlying and electrically connected to the second conductive region, the third drain region being associated with the third gate structure. The process of this particular embodiment can still further include forming a fourth drain region overlying and electrically connected to the second conductive region, the fourth drain region being associated with the fourth gate structure. A further embodiment of this particular embodiment can include first conductive region and the second conductive region have a first conductivity type, and the substrate includes a first region of a second conductivity type underlying and abutting the first conductive region and the second conductive region, and the first conductivity type is opposite the second conductivity type. An embodiment of this further embodiment can include the insulator region extends from a primary surface of the substrate and abuts the first region.

In a second aspect, a process of forming an electronic device can include forming a first memory cell that can include a body region, and a drain region electrically connected to a bitline segment of a nonvolatile memory array. The process can also include forming a second memory cell that includes a body region that is physically isolated from the body region of the first memory cell, and a drain region electrically connected to the bitline segment.

In an embodiment of the second aspect, the body region of the first memory cell has a first conductivity type, and forming the first memory cell can further include forming a source region electrically connected to the body region of the first memory cell, wherein the source region has a second conductivity type that is opposite the first conductivity type.

In another embodiment of the second aspect, the body region of the first memory cell and the body region of the second memory cell can have a first conductivity type. This embodiment of the second aspect can further include forming a region of a second conductivity type between and abutting the body region of the first memory cell and the body region of the second memory cell as viewed from a top view.

Another embodiment of the second aspect can include forming a third memory cell that includes the body region of the second memory cell, and a drain region electrically connected to the bitline segment.

Another embodiment of the second aspect can include providing a substrate including the bitline segment prior to forming the first memory cell.

In another embodiment of the second aspect, the first memory cell can includes a gate structure, wherein the body region of the first memory cell is between the gate structure and the bitline segment.

In another embodiment of the second aspect, the first memory cell includes a gate structure, wherein the body region of the first memory cell is between the gate structure and the bitline segment.

In another embodiment of the second aspect, the first memory cell and the drain region of the second memory cell can be included at a shared drain region.

In a third aspect, an electronic device can include a substrate including a conductive region below a primary surface of the substrate. The electronic device can also include first memory cell, of a nonvolatile memory array, including a body region, a gate structure, a source region, and a drain region, the gate structure including a gate dielectric and a charge storage region, wherein the drain region overlies and is electrically connected to the conductive region, and the body region is between the gate structure and the conductive region. The electronic device can also include a second memory cell, of the nonvolatile memory array, including a body region, a gate structure, a source region, and a drain region, the gate structure including a gate dielectric and a charge storage region, wherein the drain region overlies and is electrically connected to the conductive region, and the body region being between the gate structure and the conductive region.

An embodiment of the third aspect can further include an isolating region surrounding the body region of the first memory cell that physically isolates the body region of the first memory cell from the body region of the second memory cell, wherein the isolating region includes a tie region that electrically connects the drain region of the first memory cell and the drain region of the second memory cell to the conductive region.

Another embodiment of the third aspect can include a shared drain region that includes the drain region of the first memory cell and the drain region of the second memory cell.

Another embodiment of the third aspect can include the source region of the first memory cell and the body region of the first memory cell being electrically connected to each other, the source region of the second memory cell and the body region of the second memory cell being electrically connected to each other, and the body region of the first memory cell is physically isolated from the body region of the second memory cell. This particular embodiment of the third aspect can further include the body region of the first memory cell overlying and abutting the conductive region, the body region of the second memory cell overlying and abutting the conductive region, the body regions of the first and second memory cells having a first conductivity type, and the conductive region having a second conductivity type that is opposite the first conductivity type In a fourth aspect, an electronic device can include a first memory cell, of a nonvolatile memory array, including a body region, a gate structure, a source region, and a drain region. The electronic device can also include a second memory cell, of the nonvolatile memory array, include a body region that is physically isolated from the body region of the first memory cell, a gate structure, a source region, and a drain region. The electronic device can also include a bitline segment electrically connected to the drain region of the first memory cell and to the drain region of the second memory cell.

In one embodiment of the fourth aspect, the source region of the first memory cell and the body region of the first memory cell can be electrically connected, and the source region of the second memory cell and the body region of the second memory cell are electrically connected each other.

In another embodiment of the fourth aspect, the electronic device further comprises a tie region of a first conductivity type electrically connected to the drain region of the first memory cell and to the drain region of the second memory cell, the body region of the first memory cell and the body region of the second memory cell having a second conductivity type opposite the first conductivity type, the body region of the first memory cell abutting the tie region, and the body region of the second memory cell abutting the tie region.

Many details have been described with respect to the NVM array, its memory cells, bitlines, and wordlines. After reading this specification, skilled artisans will appreciate that the row and column orientations can be reversed. Electrically connections between memory cells and their associated bitlines, gate lines, or any combination thereof along one or more rows can be changed to one or more columns. Similarly, electrically connections between memory cells and their associated bitlines, gate lines, or any combination thereof along one or more columns can be changed to one or more rows. In addition, it will be appreciated that an NVM array based upon m-channel memory cells can be implemented by reversing the conductivity types of the various regions and layers described above.

Embodiments as described herein are useful in forming NVM arrays or a portion thereof. Many different aspects and embodiments are possible. Some of those aspects and embodiments are described below. After reading this specification, skilled artisans will appreciate that those aspects and embodiments are only illustrative and do not limit the scope of the present invention.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires. For example, referring to FIG. 13, one skilled in the art will appreciate that while the dielectric regions 341-343 have been removed, in other embodiments, the dielectric regions 341-343 can be used as an etch stop layer and would remain at FIG. 13.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device, the process comprising:
    providing a substrate that includes a conductive region that is below and spaced apart from a primary surface of the substrate;
    forming a first gate structure overlying a first body region at a location where a first memory cell of a nonvolatile memory array is being formed, wherein the first body region is between the first gate structure and the conductive region, and the first body region overlies the conductive region;
    forming a second gate structure overlying a second body region at a location where a second memory cell of the nonvolatile memory array is being formed, wherein the second body region is between the second gate structure and the conductive region, and the second body region overlies the conductive region; and forming first and second drain regions over and electrically connected to the conductive region, wherein the first drain region is part of the first memory cell, and the second drain region is part of the second memory cell, wherein a combination of the first and second drain regions and the conductive region is part of a common drain region for the first and second memory cells.

2. The process of claim 1, further comprising forming first and second source regions over the conductive region, wherein the first source region is part of the first memory cell, and the second source region is part of the second memory cell, wherein the first and second source regions are electrically connected to a same source line, spaced apart from one another, and the first source region is a closest source region to the second source region.

3. The process of claim 1 wherein the first and second drain regions are spaced apart from each other.

4. The process of claim 1, wherein the conductive region, the first drain region, and the second drain region have a first conductivity type, and the first body region and the second body region have a second conductivity type that is opposite the first conductivity type.

5. The process of claim 1, wherein the first drain region abuts the conductive region.

6. The process of claim 1, wherein each of the first and second memory cells includes a planar transistor.

7. The process of claim 1, wherein the conductive region has a first conductivity type, the first body region and the second body region have a second conductivity type and abut the conductive region, and the second conductivity type is opposite the first conductivity type.

8. The process of claim 1, wherein the conductive region is a first conductive region, and the substrate further includes a second conductive region that as viewed from a top view is spaced apart from the first conductive region by an insulator region, the process further comprising:
forming a third gate structure overlying a third body region at a location where a third memory cell of the nonvolatile memory array is being formed, wherein the third body region is between the third gate structure and the second conductive region;
forming a fourth gate structure overlying a fourth body region at a location where a fourth memory cell of the nonvolatile memory array is being formed, wherein the fourth body region is between the fourth gate structure and the second conductive region;
forming a third drain region overlying and electrically connected to the second conductive region, the third drain region being associated with the third gate structure; and
forming a fourth drain region overlying and electrically connected to the second conductive region, the fourth drain region being associated with the fourth gate structure.

9. The process of claim 8, wherein the insulator region extends from the primary surface of the substrate, abuts the first conductive region, and electrically insulates the first conductive region from another conductive region of another bitline segment.

10. The electronic device of claim 1, wherein the common drain region is common only to memory cells for nonvolatile memory array segment.

11. A process of forming an electronic device, the process comprising:
providing a substrate including a conductive region below and spaced apart from a primary surface of the substrate;
forming a first memory cell that includes a body region, and a drain region electrically connected to a bitline segment of a nonvolatile memory array; and
forming a second memory cell that includes a body region, and a drain region electrically connected to the bitline segment,
wherein:
the drain regions of the first and second memory cells are spaced apart from one another; and
the bitline segment includes the conductive region.

12. The process of claim 11, wherein the body region of the first memory cell has a first conductivity type, and forming the first memory cell further includes forming a source region electrically connected to the body region of the first memory cell, wherein the source region has a second conductivity type that is opposite the first conductivity type.

13. The process of claim 11, wherein the body region of the first memory cell and the body region of the second memory cell have a first conductivity type, the process further comprising:
forming a region of a second conductivity type between and abutting the body region of the first memory cell and the body region of the second memory cell as viewed from a top view.

14. The process of claim 11 further comprising:
forming a third memory cell that includes the body region of the second memory cell, and a drain region electrically connected to the bitline segment.

15. The process of claim 11, wherein:
forming the first memory cell comprises forming the first memory cell including a source region;
forming the second memory cell comprises forming the second memory cell including a source region that is spaced apart from the source regions of the first memory cell; and
the process further comprises forming a tie region, wherein the tie region lies between and abuts the source regions of the first and second memory cells.

16. The process of claim 11, further comprising forming a third memory cell that includes a body region, and a drain region electrically connected to a different bitline segment of a nonvolatile memory array, wherein:
the different bitline segment includes a different conductive region that is spaced apart from and below the primary surface of the substrate;
an insulator is disposed between the bitline segments; and
the first and third memory cells are electrically connected to a same wordline.

17. The process of claim 11, wherein the first memory cell and the drain region of the second memory cell are included at a shared drain region.

18. An electronic device comprising:
a substrate including a conductive region spaced apart from and below a primary surface of the substrate;
a first memory cell, of a nonvolatile memory array, including a first planar transistor that includes a body region, a gate structure, a source region, and a drain region, wherein the gate structure includes a gate dielectric and a charge storage region, wherein the drain region overlies and is electrically connected to the conductive region, and the body region is between the gate structure and the conductive region; and
a second memory cell, of the nonvolatile memory array, including a second planar transistor that includes a body region, a gate structure, a source region, and a drain region, wherein the gate structure includes a gate dielectric and a charge storage region, wherein the drain region overlies and is electrically connected to the conductive region, and the body region being between the gate structure and the conductive region, wherein a conductive line overlying the gate structures and the source regions of the first and second planar transistors, wherein the conductive line is electrically connected the source regions of the first and second memory cells.

19. The electronic device of claim 18 further comprising:

a third memory cell, of a nonvolatile memory array, including a third planar transistor that includes a body region, a gate structure, a source region, and a drain region, wherein the gate structure includes a gate dielectric and a charge storage region; and an isolating region surrounding the body region of the first memory cell that physically isolates the body region of the first memory cell from the body region of the third memory cell, wherein the sources of the first and third memory cells are electrically connected to different source lines.

20. The electronic device of claim 18, further comprising a tie region that is between the source regions of the first and second memory cells, wherein the tie and sources and body regions of the first and second memory cells are electrically connected to one another.

* * * * *